(12) United States Patent
Kaneko

(10) Patent No.: US 7,470,986 B2
(45) Date of Patent: Dec. 30, 2008

(54) MOUNTING STRUCTURE, ELECTRO-OPTICAL DEVICE, AND ELECTRONIC APPARATUS

(75) Inventor: Ken Kaneko, Azumino (JP)

(73) Assignee: Sanyo Epson Imaging Devices Corp. (JP)

( * ) Notice: Subject to any disclaimer, the term of this patent is extended or adjusted under 35 U.S.C. 154(b) by 340 days.

(21) Appl. No.: 11/462,460

(22) Filed: Aug. 4, 2006

(65) Prior Publication Data

US 2007/0031995 A1 Feb. 8, 2007

(30) Foreign Application Priority Data

Aug. 8, 2005 (JP) ............... 2005-229129

(51) Int. Cl.
*H01L 23/48* (2006.01)
(52) U.S. Cl. .................. 257/753; 257/665; 257/688; 257/783; 257/E23.16
(58) Field of Classification Search .............. 257/665, 257/688, 753, 783
See application file for complete search history.

(56) References Cited

U.S. PATENT DOCUMENTS

| 5,120,665 | A | * | 6/1992 | Tsukagoshi et al. .......... 156/64 |
| 5,578,527 | A | | 11/1996 | Chang et al. |
| 5,749,997 | A | | 5/1998 | Tang et al. |
| 5,783,465 | A | | 7/1998 | Canning et al. |
| 6,713,844 | B2 | | 3/2004 | Tatsuta et al. |
| 2002/0024302 | A1 | * | 2/2002 | Wu et al. ................. 313/582 |
| 2004/0234763 | A1 | * | 11/2004 | Saito ................... 428/402.2 |

FOREIGN PATENT DOCUMENTS

| JP | 2001-110831 | 4/2001 |
| JP | 2002-270647 A | 9/2002 |

\* cited by examiner

*Primary Examiner*—Wai-Sing Louie
(74) *Attorney, Agent, or Firm*—Harness, Dickey & Pierce, P.L.C.

(57) ABSTRACT

A mounting structure is provided. The mounting structure includes: a substrate; a line formed on the substrate; an electronic component in which a terminal having a protrusion protruded to the substrate and made of an elastic material and a conductive member disposed on the protruded surface of the protrusion and electrically connected to the line is disposed on a mounting surface of the electronic component opposed to the substrate; and an adhesive in which metal powders, a part of which is interposed between the conductive member and the line, are mixed and which serves to bond and fix the electronic component to the substrate. Here, the conductive member and the line interpose the metal powders therebetween and come in surface-contact with each other.

8 Claims, 8 Drawing Sheets

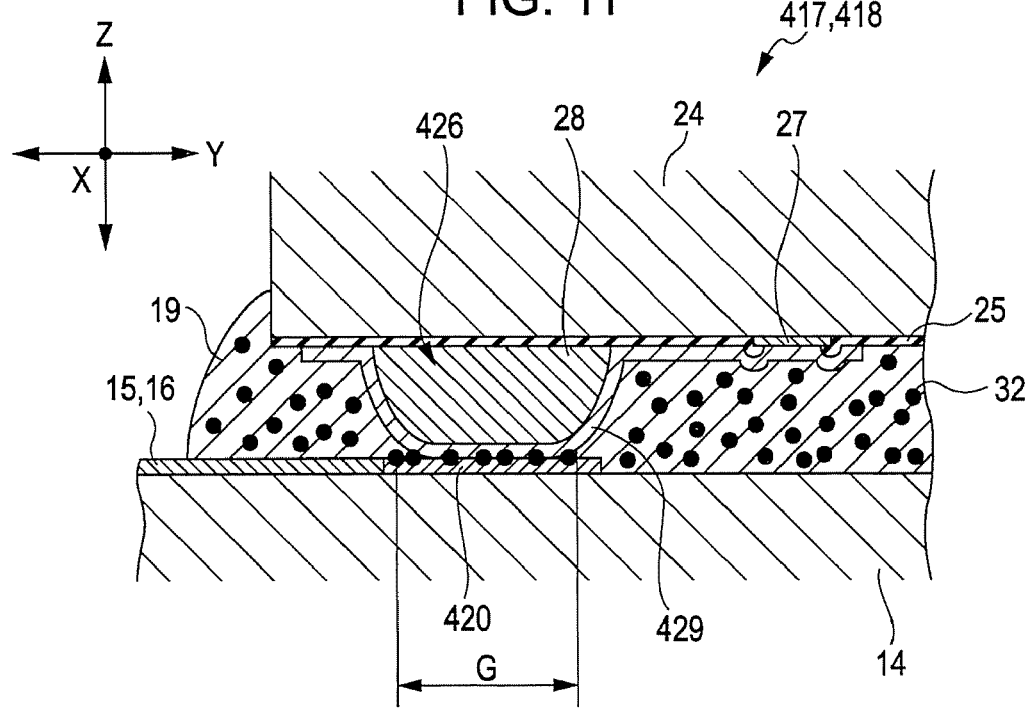
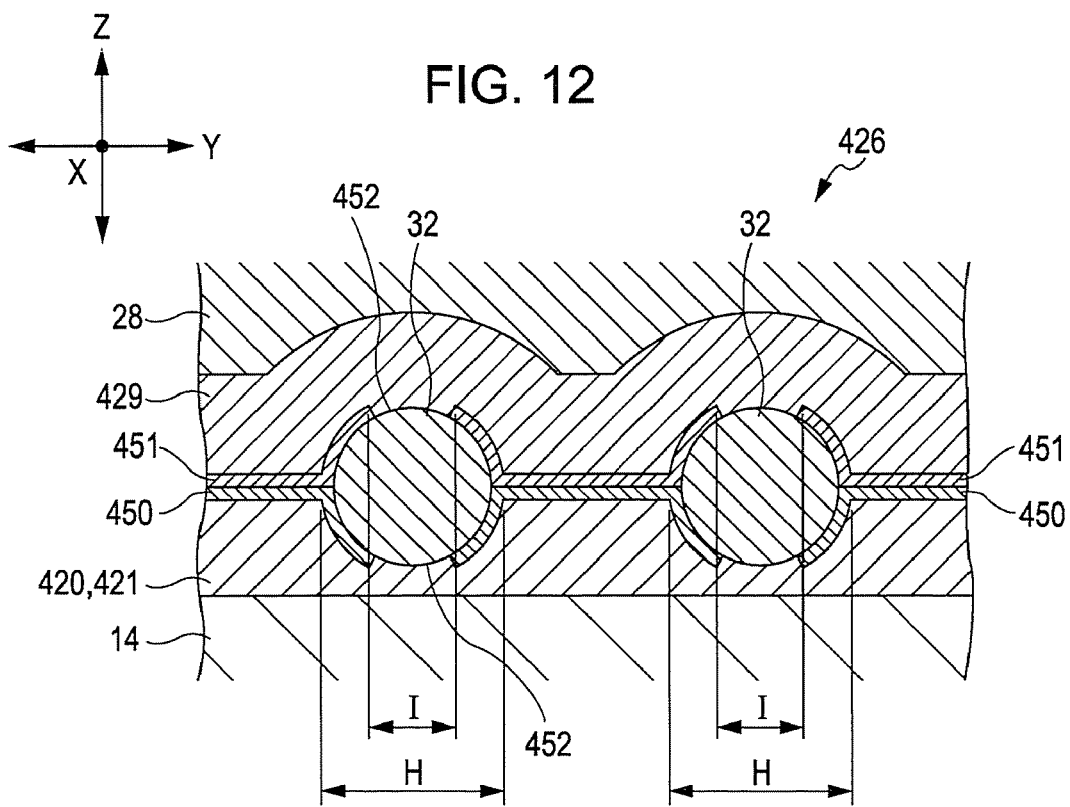

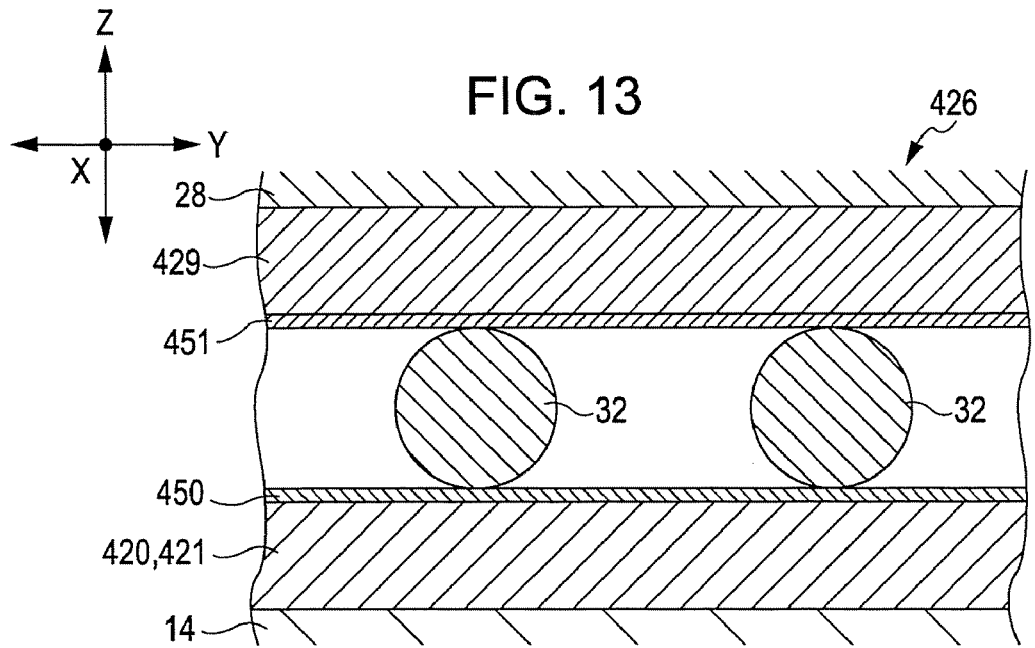
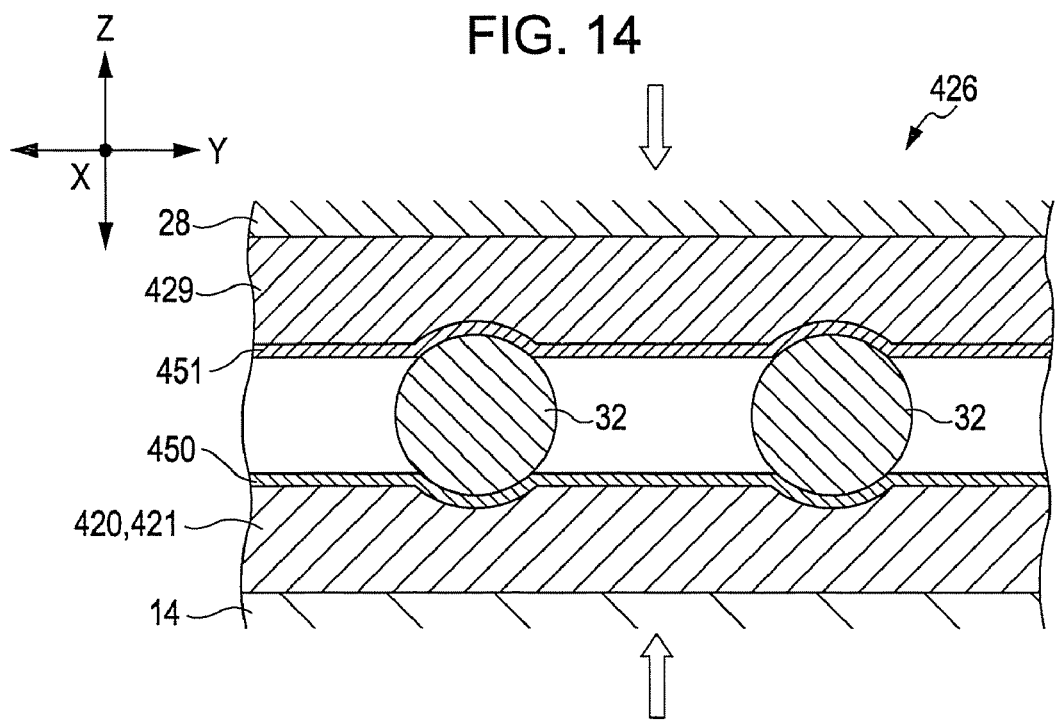

MOUNTING STRUCTURE, ELECTRO-OPTICAL DEVICE, AND ELECTRONIC APPARATUS

BACKGROUND

1. Technical Field

The present invention relates to a mounting structure used for a personal computer, a mobile phone, or the like, an electro-optical device employing the mounting structure, and an electronic apparatus employing the electro-optical device.

2. Related Art

Electro-optical devices such as liquid crystal display devices are known as a display unit of electronic apparatuses such as personal computers or mobile phones. Electronic components such as semiconductor devices are mounted on the liquid crystal display devices, for example, by a flip chip bonding method.

In recent years, decrease in size and enhancement in performance have been required for personal computers or mobile phones and decrease in distance between lines including terminals on a substrate, that is, decrease in pitch, has been required. Accordingly, in order to cope with such requirements, decrease in pitch, that is, considerable height with respect to width, has been required for terminals of electronic components.

However, in order to heighten bumps as terminals in the above-mentioned flip chip mounting method, the amount of metal to be used increases and the manufacturing processes are complicated, thereby increasing the manufacturing cost. There has been suggested an external connection protrusion having a protruded member formed in the vicinity of an electrode of a semiconductor chip and a conductive member continuously formed on the electrode and the protruded member (for example, see Paragraph Nos. 0006 to 0007 and FIG. 1 of JP-A-2001-110831).

However, although a considerable height was provided with respect to the width and the amount of metal as a material could be reduced as described above, the further decrease in pitch is required to accomplish the further decrease in size and the further enhancement in performance and thus the widths of the terminals of electronic components and the lines of a substrate should be reduced. As a result, contact resistance between the terminals of the electronic components and the lines of the substrate increases, thereby not accomplishing the enhancement in performance at low cost.

SUMMARY

An advantage of the invention is that it provides a mounting structure which can reduce contact resistance between terminals of electronic components and lines on a substrate at low cost for decrease in pitch, an electro-optical device employing the mounting structure, and an electronic apparatus employing the electro-optical device.

According to an aspect of the invention, there is provided a mounting structure comprising: a substrate; a line formed on the substrate; an electronic component in which a terminal having a protrusion protruded to the substrate and made of an elastic material and a conductive member disposed on the protruded surface of the protrusion and electrically connected to the line is disposed on a mounting surface of the electronic component opposed to the substrate; and an adhesive in which metal powders, a part of which is interposed between the conductive member and the line, are mixed and which serves to bond and fix the electronic component to the substrate. Here, the conductive member and the line interpose the metal powders therebetween and come in surface-contact with each other.

The "electronic component" includes a semiconductor device such as a liquid crystal driving IC, a semiconductor element, a resistor, or a capacitor. The "line" includes an electrical line formed on a glass substrate or terminals electrically connected to a bump as a terminal of the electronic component. "The conductive member comes in surface-contact with the line" includes a case in which the conductive member comes in contact with the line with an oxide layer formed on at least one of the conductive member and the line, in addition to the case in which the conductive member comes in direct contact with the line.

In the above-mentioned aspect of the invention, since the metal powders are mixed in the adhesive and the metal powders are interposed between the conductive member and the line, it is possible to reduce contact resistance between the terminal of the electronic component and the line on the substrate at low cost, by forming a concave surface in at least one of the contact surfaces of the conductive member and the line and increasing the electrical contact area between the conductive member and the line including the area interposing the conductive metal powders.

When the size of the metal powders is smaller than the size of micro gaps (for example, gaps between metal particles of the conductive member or the line) formed in the contact surfaces of the conductive member and the line, the metal powders are inserted into the gaps, thereby further increasing the electrical contact area between the conductive member and the line. Accordingly, it is possible to reduce the contact resistance between the terminal of the electronic component and the line on the substrate at low cost.

According to another aspect of the invention, there is provided an electro-optical device comprising: an electro-optical device substrate; a line formed on the electro-optical device substrate; an electronic component in which a terminal having a protrusion protruded to the electro-optical device substrate and made of an elastic material and a conductive member disposed on the protruded surface of the protrusion and electrically connected to the line is disposed on a mounting surface of the electronic component opposed to the electro-optical device substrate; and an adhesive in which metal powders, a part of which is interposed between the conductive member and the line, are mixed and which serves to bond and fix the electronic component to the electro-optical device substrate. Here, the conductive member and the line interpose the metal powders therebetween and come in surface-contact with each other.

In the above-mentioned aspect of the invention, since the metal powders are mixed in the adhesive and the metal powders are interposed between the conductive member and the line, it is possible to provide an electro-optical device with reduced contact resistance between the terminal of the electronic component and the line on the substrate at low cost, by forming a concave surface in at least one of the contact surfaces of the conductive member and the line and increasing the electrical contact area between the conductive member and the line including the area interposing the conductive metal powders.

When the size of the metal powders is smaller than the size of micro gaps (for example, gaps between metal particles of the conductive member or the line) formed in the contact surfaces of the conductive member and the line, the metal powders are inserted into the gaps, thereby further increasing the electrical contact area between the conductive member and the line. Accordingly, it is possible to reduce the contact resistance between the terminal of the electronic component and the line on the substrate at low cost.

In an embodiment of the invention, the size of the metal powders may be smaller than a sum of the height of the conductive member from the surface of the protrusion and the height of the line from the surface of the electro-optical device substrate in the surface-contact area. Accordingly, for example, when the protrusion or the electro-optical device substrate is hard, it is possible to prevent the metal powders from partially destroying the conductive member or the line not to reduce the contact resistance sufficiently. In addition, it is possible to prevent the conductive member or the line around the metal powders from being partially removed from the contact surface not to increase the electrical contact area sufficiently due to too large metal powders. Accordingly, it is possible to reduce the contact resistance between the terminal of the electronic component and the electro-optical device substrate at low cost.

According to another aspect of the invention, there is provided an electro-optical device comprising: an electro-optical device substrate; a circuit board electrically connected to the electro-optical device substrate; a line formed on the circuit board; an electronic component in which a terminal having a protrusion protruded to the circuit board and made of an elastic material and a conductive member disposed on the protruded surface of the protrusion and electrically connected to the line is disposed on a mounting surface of the electronic component opposed to the circuit board; and an adhesive in which metal powders, a part of which is interposed between the conductive member and the line, are mixed and which serves to bond and fix the electronic component to the circuit board. Here, the conductive member and the line interpose the metal powders therebetween and come in surface-contact with each other.

In the above-mentioned aspect of the invention, since the metal powders are mixed in the adhesive and the metal powders are interposed between the conductive member and the line, it is possible to provide an electro-optical device with reduced contact resistance between the terminal of the electronic component and the line on the substrate at low cost, by forming a concave surface in at least one of the contact surfaces of the conductive member and the line and increasing the electrical contact area between the conductive member and the line including the area interposing the conductive metal powders.

When the size of the metal powders is smaller than the size of micro gaps (for example, gaps between metal particles of the conductive member or the line) formed in the contact surfaces of the conductive member and the line, the metal powders are inserted into the gaps, thereby further increasing the electrical contact area between the conductive member and the line. Accordingly, it is possible to reduce the contact resistance between the terminal of the electronic component and the line on the substrate at low cost.

In an embodiment of the invention, the size of the metal powders may be smaller than a sum of the height of the conductive member from the surface of the protrusion and the height of the line from the surface of the electro-optical device substrate in the surface-contact area. Accordingly, for example, when the protrusion or the circuit board is hard, it is possible to prevent the metal powders from partially destroying the conductive member or the line not to reduce the contact resistance sufficiently. In addition, it is possible to prevent the conductive member or the line around the metal powders from being partially removed from the contact surface not to increase the electrical contact area sufficiently due to too large metal powders. Accordingly, it is possible to reduce the contact resistance between the terminal of the electronic component and the circuit board at low cost.

In an embodiment of the invention, the amount of metal powders added to the adhesive may be 0.5 wt % or more and 30 wt % or less. Accordingly, it is possible to prevent a sufficient amount of metal powders from not being interposed between the conductive member and the line because the amount of metal powders is smaller than 0.5 wt %. In addition, it is possible to prevent the neighboring lines or the neighboring terminals of the electronic component from being short-circuited because the amount of metal powders is greater than 30 wt %.

In an embodiment of the invention, the hardness of the metal powders may be equal to or greater than the hardness of one or both of the conductive member and the line. Accordingly, it is possible to prevent the interposed metal powders from being crushed not to sufficiently form the concave surface in the conductive member or the line.

In an embodiment of the invention, the metal powders may be driven into one or both of the conductive member and the line. Accordingly, the concave surface can be formed by driving the metal powders into at least one of the conductive member and the line. It is also possible to increase the electrical contact area between the conductive member and the line, the contact surfaces of which are a plane, by the concave surface. It is possible to prevent the conductive member and the line around the interposed metal powders from being drawn and separated from each other by the metal powders, by driving the metal powders thereto.

In an embodiment of the invention, one or both of the conductive member and the line may have an oxide layer covering the surface thereof, and the oxide layer may have an opening formed in a part of the oxide layer due to the interposed metal powders. Accordingly, even when an oxide layer is formed on the surface of the conductive member or the line during manufacturing an electro-optical device, the oxide layer is widely spread by the metal powders and the thickness of the oxide layer is reduced or a part thereof is destroyed, thereby forming the opening. Accordingly, it is possible to further reduce the contact resistance between the conductive member and the line due to the oxide layer.

Here, the "opening" indicates a portion in which the conductive member or the line covered with the oxide layer is exposed or a portion in which the conductive member or the line is not exposed but the thickness of the oxide layer is reduced.

In an embodiment of the invention, a plurality of terminals may be provided and the protrusion may be formed every terminal. Accordingly, since the protrusions of the neighboring terminals of the electronic component are separated from each other, it is possible to further reduce the short-circuit possibility between the neighboring terminals even with further decrease in pitch. As a result, it is possible to enhance the reliability of electrical connection between the lines of the electro-optical device surface and the terminals of the electronic component.

The adhesive can be more easily diffused between the neighboring protrusions. Accordingly, it is possible to reduce non-uniform stress or non-uniform mixture of the metal powders mixed in the adhesive in the mounting area of the electronic component mounted on the electro-optical device substrate.

In an embodiment of the invention, the conductive member may include a first conductive member disposed on the protrusion and a second conductive member disposed on the first conductive member, and the second conductive member may be made of gold or titanium. Accordingly, even when the second conductive member is made of gold or titanium and the protrusion is made of resin, by disposing nickel as the first conductive member therebetween, it is possible to surely form the conductive member on the protrusion and to prevent increase in cost due to the conductive member all made of gold.

In an embodiment of the invention, one metal particle of the metal powders may be interposed in the direction perpendicular to the contact surface between the conductive member and the line. Accordingly, it is possible to prevent two metal particles from being interposed in the direction perpendicular to the contact surface to destroy the conductive member or the like or to make the contact state around the interposed metal particles unstable. As a result, it is possible to make the electrical connection between the terminal of the electronic component and the line more stable.

In an embodiment of the invention, the metal powders may have a diameter of 0.1 μm or more and 5 μm or less. Accordingly, for example, when the protrusion or the circuit board is hard, it is possible to prevent the metal powders from partially destroying the conductive member or the line not to reduce the contact resistance sufficiently due to two large metal powders. In addition, it is possible to prevent the conductive member or the line around the metal powders from being partially removed from the contact surface not to increase the electrical contact area sufficiently due to too large metal powders. Accordingly, it is possible to reduce the contact resistance between the terminal of the electronic component and the circuit board at low cost. In addition, it is possible to prevent the concave surface from not being formed in an enough size to further increase the electrical contact area between the conductive member and the line due to too small metal powders.

According to another aspect of the invention, there is provided an electronic apparatus comprising the above-mentioned electro-optical device.

In the aspect of the invention, since the electro-optical device capable of decreasing the contact resistance between the terminal of the electronic component and the wire on the substrate or the circuit board at low cost is employed, it is possible to provide an electronic apparatus with enhanced electrical reliability at low cost.

BRIEF DESCRIPTION OF THE DRAWINGS

The invention will be described with reference to the accompanying drawings, wherein like numbers reference like elements.

FIG. 11 is a diagram illustrating a contact state between a bump and a terminal of a substrate according to a third embodiment of the invention.

FIG. 12 is a partially enlarged view of interposed metal powders and peripheries thereof of FIG. 11.

FIG. 13 a diagram illustrating a state in which a conductive member or the like first comes in contact with the metal powders after being pressed.

FIG. 14 is a diagram illustrating a state in which metal powders are further pressed and are partially driven into the conductive member or the like.

DESCRIPTION OF EXEMPLARY EMBODIMENTS

Hereinafter, exemplary embodiments of the invention will be described with reference to the drawings. In the following exemplary embodiments, a thin film transistor (TFT) active matrix type liquid crystal display device is described as an example of a mounting structure and an electro-optical device and an electronic apparatus employing the liquid crystal display device is described, but the invention is not limited to the exemplary embodiments. In the following description with reference to the drawings, the scales or the numbers of elements are different from those of actual elements, for the purpose of easy understanding.

First Embodiment

Figure 1:
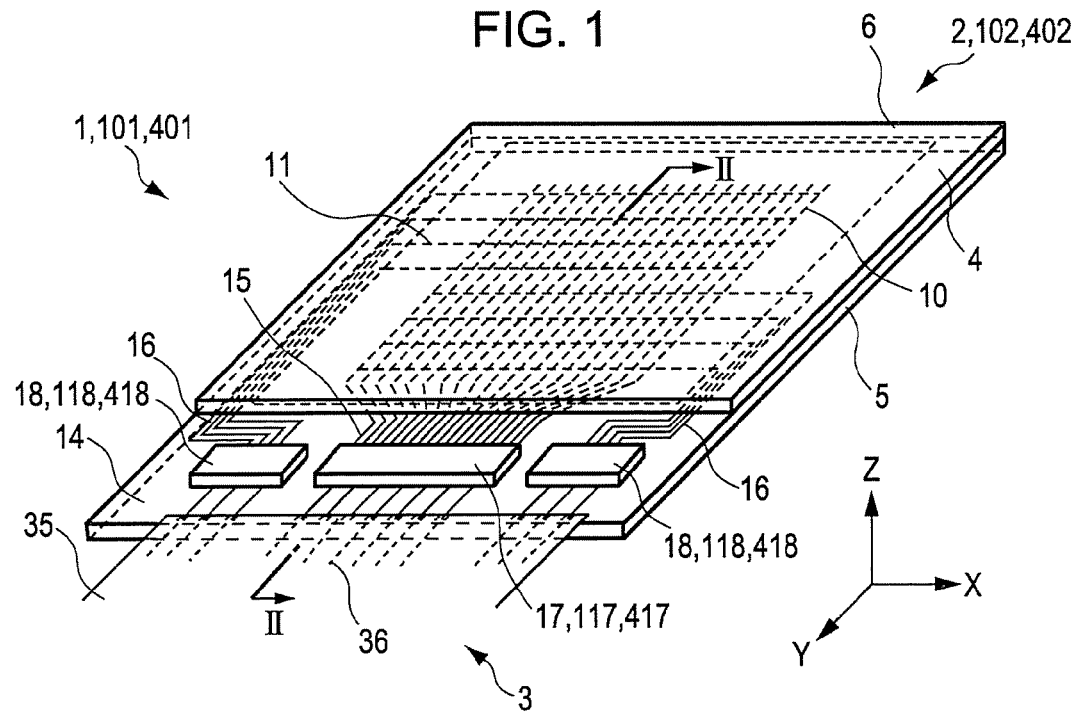
FIG. 1 is a schematic perspective view of a liquid crystal display device according to a first embodiment of the invention.
Figure 2:
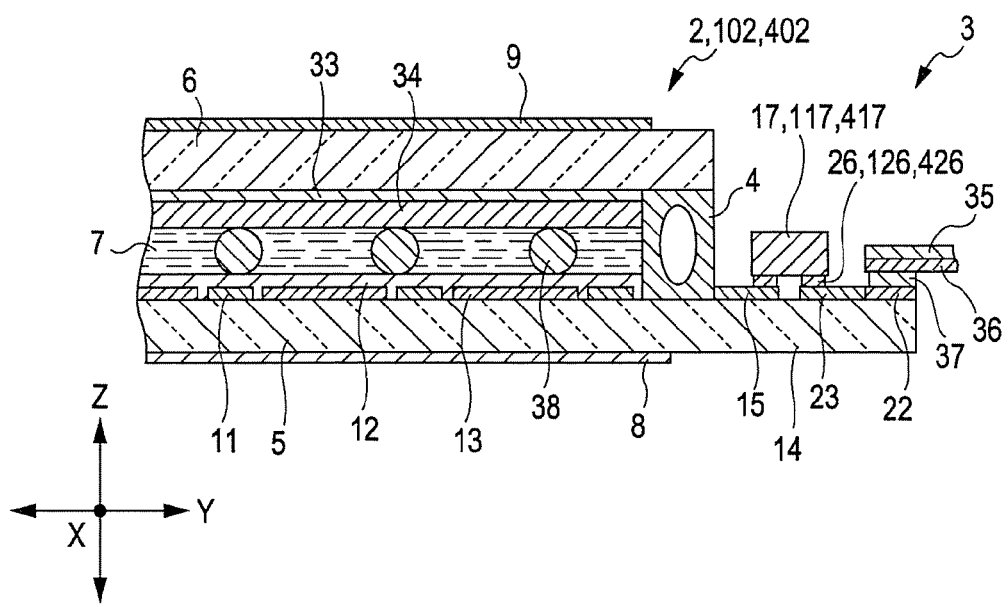
FIG. 2 is a schematic cross-sectional view taken along Line II-II of FIG. 1 according to the first embodiment.
Figure 3:
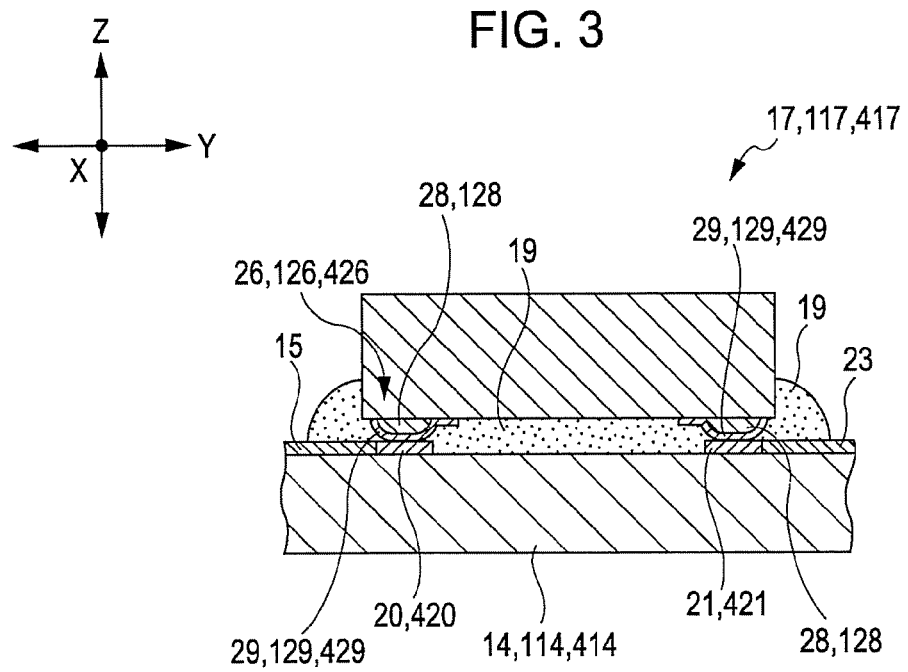
FIG. 3 is a diagram illustrating a mounting state of an X driver according to the first embodiment.
Figure 4:
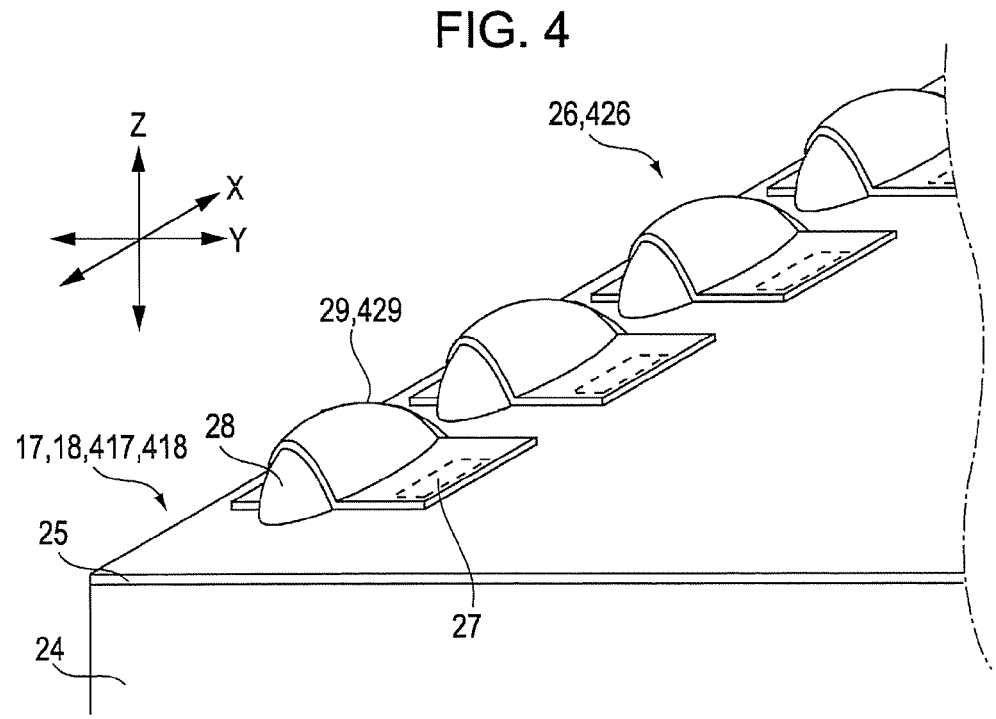
FIG. 4 is a partial schematic perspective view of a mounting surface of X and Y drivers according to the first embodiment.
Figure 5:
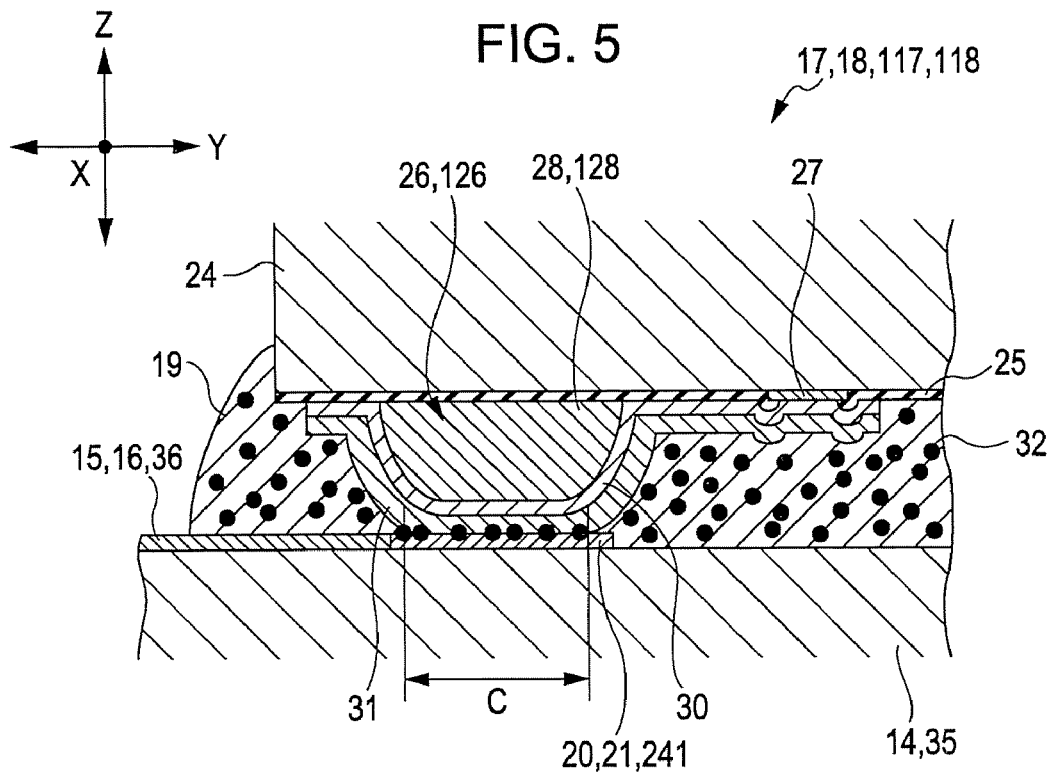
FIG. 5 is a partial schematic sectional view of a bump of the mounted X and Y drivers.
Figure 6:
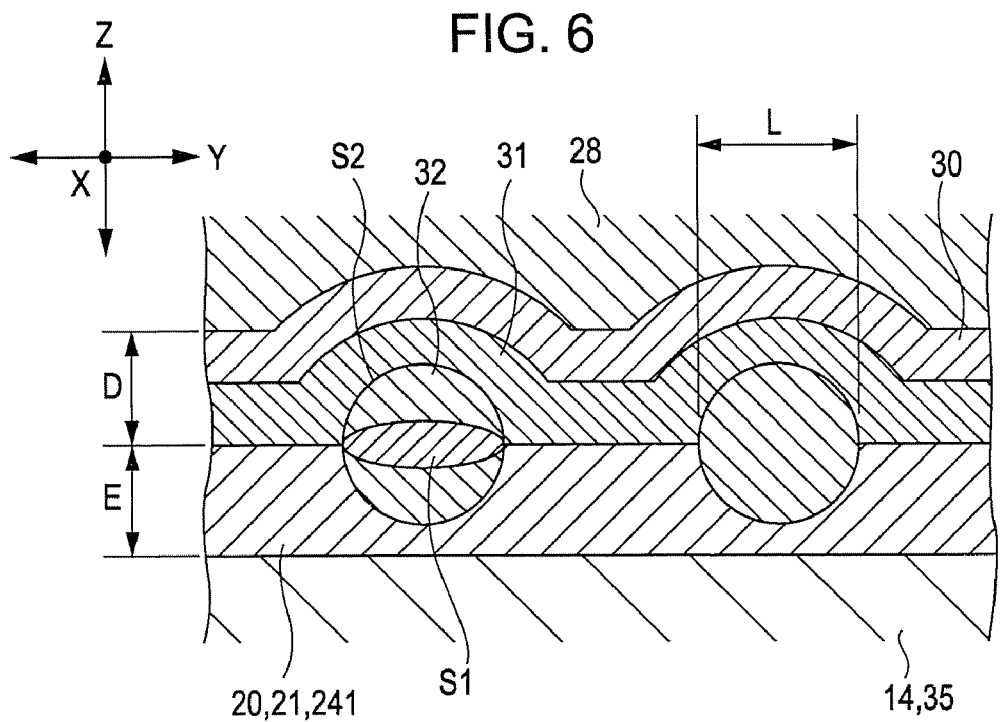
FIG. 6 is an enlarged diagram illustrating a contact state between a bump and a terminal of a substrate according to the first embodiment.

FIG. 1 is a schematic perspective view of a liquid crystal display device according to a first embodiment of the invention, FIG. 2 is a schematic sectional view taken along Line II-II of FIG. 1 according to the first embodiment (where an X driver is not cut), FIG. 3 is a diagram illustrating a mounting state of an X driver, FIG. 4 is a partial schematic perspective view of a mounting surface of X and Y drivers, FIG. 5 is a partial schematic sectional view of a bump of the mounted X and Y drivers, and FIG. 6 is an enlarged diagram illustrating a contact state between a bump and a terminal on a substrate.

Configuration of Liquid Crystal Display Device

As shown in FIG. 1, a liquid crystal display device 1 includes a liquid crystal panel 2 as a mounting structure and a flexible substrate 3 which is a circuit board electrically connected to the liquid crystal panel 2. In addition to the flexible substrate 3, a lighting unit such as a backlight or other accessory mechanisms (not shown) can be attached to the liquid crystal display device 1 as needed.

As shown in FIGS. 1 and 2, the liquid crystal panel 2 includes a first substrate 5 and a second substrate 6 as electro-optical device substrates bonded to each other with a sealing member 4, and a liquid crystal as an electro-optical material such as a twisted nematic (TN) liquid crystal 7 enclosed between the first and second substrates 5 and 6.

The first and second substrates 5 and 6 are plate-shaped members made of a material such as glass having a light transmitting property and as shown in FIG. 2, polarizing films 8 and 9 for polarizing an incident beam are bonded to the outer surfaces (the surfaces opposite to the liquid crystal) of the first and second substrates 5 and 6.

On the inner surface (the surface facing the liquid crystal) of the first substrate 5, as shown in FIGS. 1 and 2, gate electrodes 10 are formed in the Y axis direction, source electrodes 11 as signal lines are formed in the X axis direction, alignment layers 12 are formed on the sides facing the liquid crystal of the gate electrode 10 and the source electrodes 11. The gate electrodes 10 and the source electrodes 11 are made of nickel and are electrically connected to TFTs not shown. The TFTs are electrically connected to pixel electrodes 13 made of indium tin oxide (ITO).

Accordingly, in the gate electrodes 10 and the source electrode 11, when a voltage is applied to the gate electrodes 10, current flows from the source electrodes 11 to the pixel electrodes 13 or reversely. The source electrodes 11 serves to supply a data signal to pixel electrodes 13, and the pixel electrodes 13 serve to apply a voltage to the liquid crystal 7 interposed therebetween through a common electrode to be described later.

The first substrate 5 includes an extension 14 extending from the outer circumference of the second substrate 6. Gate electrode lines 15 and source electrode lines 16 extending to the extension 14 from an area in which the gate electrodes 10 and the source electrodes 11 are surrounded with the sealing member 4 are formed in the extension 14. An X driver 17 and a Y driver 18 for driving the liquid crystal as electronic components electrically connected to the electrode lines are mounted with an adhesive 19 therebetween.

As shown in FIG. 3, electrode terminals 20 as lines electrically connected to the gate electrode lines 15 and the source electrode lines 16 and input terminals as lines for inputting current from the flexible substrate 3 to the X and Y drivers 17 and 18 are formed in the area corresponding to a mounting surface of the X and Y drivers 17 and 18 on the extension 14.

As shown in FIG. 2, external terminals 22 for receiving current from the flexible substrate 3 or the like and input lines 23 as lines for supplying the external current to the input terminals 21 are formed in the extension 14.

As shown in FIGS. 4 and 5, the X and Y drivers 17 and 18 include a driver body 24, an insulating layer 25 covering the mounting surface of the driver body 24, and a plurality of bumps 26 as terminals of the electronic components on the insulating layer 25.

Although not shown, lines including elements such as transistors stacked in some layers are formed in the driver body 24. A part of the lines in the driver body 24 form pads 27 which are exposed from contact holes formed in the insulating layer 25 and are electrically connected to the bumps 26, as shown in FIG. 5.

The bumps 26 are arranged separate from each other on the surface of the insulating layer 25 as the mounting surface of the X and Y drivers 17 and 18, as shown in FIG. 4, and include a protrusion 28 protruded to the electrode terminals or the input terminals as lines of an electro-optical device substrate (to the first substrate side as an electro-optical device substrate) from the insulating layer 25 and a conductive member 29 formed on the protruded surface of the protrusion 28.

The protrusion 28 is made of an elastic member such as epoxy resin and has a shape obtained by partially cutting out a sphere so that the cut surface is a plane, as shown in FIG. 4. Accordingly, it is possible to make the contact surface with the electrode terminals or the like more stable and larger in contact area.

The conductive member 29 is formed on the protruded surface of the protrusion 28 and has a belt shape extending over the vertex of the protruded surface in the Y axis direction, as shown in FIGS. 4 and 5. An end in the Y axis direction of the belt-shaped conductive member 29 extends to the pad 27 and is electrically connected to the lines in the driver body 24 through the contact hole. The other end extends to the insulating layer 25 which is a mounting surface opposite to the pad 27 with the protrusion 28 therebetween. The pad 27 is spaced apart from the protrusion 28, as shown in FIGS. 4 and 5.

As shown in FIGS. 5 and 6, the conductive member 29 has a two-layered structure of a first conductive member 30 made of nickel or the like and a second conductive member 31 made of gold (Au), titanium (TiW), or the like, and the second conductive member 31 is located at the outermost side. Accordingly, the second conductive member 31 made of gold (Au), titanium (TiW), or the like can be formed to cover the protrusions 28 made of resin, and increase in cost due to a gold conductive member can be prevented.

As shown in FIG. 5, each bump 26 has a region C (C in FIG. 5) in which the bump 26 is further pressed and crushed in comparison with before the bump is mounted on the driver body (in the Z axis direction in FIG. 5) and the contact of the second conductive member 31 on the bump 26 with the electrode terminal is changed from a dot contact to a surface contact, thereby reducing the contact resistance between the bump 26 and the electrode terminal as a terminal of the electro-optical device substrate.

On the other hand, as shown in FIG. 3, the adhesive 19 bonds and fixes the X and Y drivers 17 and 18 to the extension 14 so that the bumps 26 on the mounting surface of the X and Y drivers 17 and 18 come in contact with the electrode terminals 20 or the input terminals 21. As shown in FIG. 5, metal powders 32 are mixed in the adhesive 19. For example, the metal powders 32 are mixed so that the amount of metal powders added to the adhesive is 0.5 wt % or more and 30 wt % or less and the metal powders are homogeneously mixed so that the metal powders are not biased to one side in the adhesive.

The amount of metal powders is set to 0.5 wt % or more so as to prevent a sufficient amount of metal powders 32 from not being interposed between the conductive members 29 and the electrode terminals due to a too small amount of metal powders. The amount of metal powders is set to 30 wt % or less so as to prevent the metal powders from being connected and short-circuited between the neighboring electrode terminals or the neighboring bumps of the electronic component due to a too large amount of metal powders.

Accordingly, in the surface-contact area C between the second conductive members 31 and the electrode terminals, as shown in FIG. 5, the metal powders 32 are interposed between the second conductive members 31 and the electrode terminals and as shown in FIG. 6, the metal powders 32 are driven into the conductive members 29 and the electrode terminals.

By driving the metal powders 32 into the conductive members 29 and the electrode terminals, the contact area between the electrode terminals and the second conductive members 31 is increased in comparison with the case in which the metal powders 32 are not interposed. As shown in FIG. 6, when the metal powders 32 are not interposed, the sectional area passing through the center is S1 (S1 in FIG. 6), the diameter of the metal powders 32 is L on the assumption that the metal powders 32 are complete spheres, the original area is $S1 = \pi L^2 / 4$.

On the other hand, when the metal powders 32 are interposed between the second conductive members 31 and the electrode terminals, as shown in FIG. 6, it is assumed that the metal powders 32 are completely covered with the electrode terminals or the second conductive members 31. Then, since the metal powders 32 are conductive, the contact area between the electrode terminals and the second conductive members 31 is the surface area S2 of the metal powders 32. That is, since $S2=\pi L^2$ and $S1<S2$, the contact area between the electrode terminals and the second conductive members 31 is increased in the case in which the metal powders 32 are interposed between the second conductive members 30 and the electrode terminals and the concave surface is formed.

As show in FIG. 6, both of the first and second conductive members 30 and 31 are protruded from the protrusions so as to be concave toward the metal powders, but the invention is not limited to the structure. For example, both of the first and second conductive members 30 and 31 may not be protruded from the protrusions, or only the second conductive members 31 may be protruded from the protrusions. If only the portions of the second conductive members 31 facing the metal powders is formed concave to correspond to the outer circumferences of the metal powders 32, it is possible to enlarge the electrical contact area.

As shown in FIG. 6, the invention is not limited to the case in which the concave surface is formed in both of the second conductive members 31 and the electrode terminals by the metal powders 32, but the concave surface may be formed in only one of the second conductive members 31 and the electrode terminals. In this case, the contact area between the electrode terminals and the second conductive members 31 is enlarged to some extent.

In FIG. 5, the protruding of the first and second conductive members 30 and 31 toward the protrusions is omitted.

As shown in FIG. 6, the diameter L of the metal powders 32 is set smaller than the sum of the height D (D in FIG. 6) of the conductive member 29 from the surface of the protrusion 28 and the height E (E in FIG. 6) of the electrode terminal 20 from the surface of the first substrate 5. For example, the diameter of the metal powders is 0.1 μm or more and 1 μM or less.

Accordingly, for example, when the protrusions 28 or the first substrate 5 is hard, it is possible to prevent the metal powders 32 from partially destroying the conductive members 29 or the electrode terminals not to reduce the contact resistance sufficiently because the metal powders is 5 μm or more. In addition, it is possible to prevent the conductive members 29 or the electrode terminals around the metal powders 32 from being partially removed from the contact surface not to increase the electrical contact area sufficiently because the interposed metal powders 32 are too large. Accordingly, it is possible to reduce the contact resistance between the terminals of the electronic component and the electro-optical device substrate at low cost.

In addition, it is possible to prevent the concave surface from not being formed in an enough size to further increase the electrical contact area between the conductive members 29 and the electrode terminals as the lines because the metal powders is smaller than 0.1 μm. The size of the metal powders is preferably 0.1 μm or more and 1 μm or less. Accordingly, it is possible to decrease the thickness of the conductive members 29 or the electrode terminals, thereby accomplishing the decrease in thickness and cost of the liquid crystal display device 1.

The hardness of the metal powders 32 is approximately equal to or greater than the hardness of at least one of the conductive member 29 and the electrode terminal. Accordingly, it is possible to prevent the interposed metal powders 32 from being crushed not to sufficiently form the concave surface in the conductive member 29 or the electrode terminal.

The adhesive 19 may be any one of thermosetting resin or thermoplastic resin. For example the adhesive is formed in the form of a film or paste out of epoxy resin. The metal powders 32 uniformly mixed therein include a conductive material such as gold (Au), silver (Ag), copper (Cu), platinum (Pt), zinc (Zn), iron (Fe), plumbum (Pb), aluminum (Al), cobalt (Co), indium (In), nickel (Ni), chromium (Cr), titanium (Ti), arsenic (As), boron (B), germanium (Ge), cadmium (Cd), silicon (Si), and tin (Sn).

As shown in FIG. 5, one particle of the metal powders 32 are interposed one in the direction (the X axis direction in FIG. 5) perpendicular to the contact surface between the second conductive member 31 and the electrode terminal, but two particles of the metal powders 32 are not interposed in the direction (the X axis direction in FIG. 5) perpendicular to the contact surface. Accordingly, it is possible to prevent the conductive members from being destroyed or the contact state around the interposed metal powders 32 from being unstable. It is also possible to make the electrical connection between the bumps 26 and the electrode terminals more stable.

On the other hand, a common electrode 33 is formed on the inner surface (facing the liquid crystal) of the second substrate 6 and an alignment layer 34 is formed on the common electrode 33.

Here, the common electrode 33 is a surface electrode formed in the entire display area which is an area contributing to the display of the liquid crystal panel 2 and is a transparent conductive film made of ITO. The alignment layer 34 is an organic thin film made of polyimide and is subjected to a rubbing process for defining the alignment state of the liquid crystal 7 when no voltage is applied thereto.

Although not shown, an underlying layer, a reflecting layer, a coloring layer, and a light shielding layer are formed on the inner side of one of the first and second substrates 5 and 6 as needed.

In the flexible substrate 3 as a circuit board, as shown in FIGS. 1 and 2, a line pattern 36 and the like are formed and mounted on a base member 35.

The base member 35 is a flexible film-shaped member, the line pattern 36 is made of, for example, copper, and extension terminals (not shown) are formed. The terminals are electrically connected to external terminals 22 through, for example, an anisotropic conductive film (ACF) 37.

Method of Manufacturing Liquid Crystal Display Device

A method of manufacturing the liquid crystal display device 1 having the above-mentioned configuration will be described in brief.

First, a liquid crystal panel 2 is manufactured.

For example, the TFTs, the gate electrodes 10, the source electrodes 11, and the pixel electrodes 13 are formed on the surface of the first substrate 5 facing the liquid crystal, and the alignment layer 12 is formed thereon and is subjected to a rubbing process, thereby completing the first substrate. The gate electrode lines 15, the source electrode line 16, the electrode terminals 20, the input terminals 21, and the external connection terminals 22 can be formed at the same time as forming the gate electrodes 10 or the source electrodes 11.

The underlying layer, the reflecting layer, or the coloring layer is formed on the liquid crystal side of the second substrate 6 as needed, the common electrode 33 is formed thereon, and the alignment layer 34 is formed and subjected to the rubbing process, thereby completing the second substrate.

A gap material 38 is deposited on the second substrate by the use of a dry deposition method and the first substrate and the second substrate are bonded to each other with the sealing member 4 therebetween. Thereafter, the liquid crystal 7 is injected through an injection port not shown of the sealing member 4, and then the injection port of the sealing member 4 is sealed with an enclosing member such as UV-curable resin.

An insulating material not shown is formed on the gate electrode lines 15, the source electrode lines 16, and the input lines 23 in the extension 14 so that the electrode terminals 20, the input terminals 21, and the external terminals 22 are exposed.

The film-shaped adhesive 19, in which the metal powders 32 are uniformly mixed in advance so that the amount of metal powders is 0.5 wt % or more and 30 wt % or less, is disposed on the first substrate 5 so as to cover the electrode terminals 20 and the input terminals 21 in the mounting area of the X driver 17 and the Y driver 18 of the extension 14.

Thereafter, the X driver 17 and the Y driver 18 are disposed and temporarily pressed on the adhesive 19 to correspond to the electrode terminals 20 and the input terminals 21.

The X driver 17 and the Y driver 18 are pressed on the electrode terminals 20 and the input terminals 21 with a predetermined pressure by the use of a pressing head, and are mainly pressed at about 300° C. and mounted thereon.

Then, as shown in FIG. 5, the metal powders 32 mixed in the adhesive 19 are interposed between the bumps 26 of the X driver 17 and the Y driver 18, and the electrode terminals 20 and the input terminals 21. By further pressing them, as shown in FIG. 6, the metal powders 32 are driven into the second conductive members 31 or the electrode terminals, and thus the concave surface is formed along the outline of the metal powders 32 driven into the second conductive members 31 or the electrode terminals. In this state, the X driver 17 and the Y driver 19 are connected and fixed to the extension 14.

Then, the polarizing films 8 and 9 are bonded to the outer surfaces of the first and second substrate 5 and 6, thereby completing the liquid crystal panel 2.

Next, the flexible substrate 3 is manufactured by forming and mounting the line patterns 36 or the connection terminals on the base member 35. Then, the connection terminals electrically connected to the line patterns 36 of the flexible substrate 3 are electrically connected to the external connection terminals 22 of the liquid crystal panel 2 through the ACF 37.

Thereafter, the lighting device such as a backlight is attached to the liquid crystal panel as needed, thereby completing the liquid crystal display device 1.

The method of manufacturing the liquid crystal display device 1 is finished.

According to the above-described embodiment, since the metal powders 32 are mixed in the adhesive 19 and the metal powders 32 are interposed between the conductive members 29 and the electrode terminals as the lines, it is possible to form the concave surface on the contact surfaces of the conductive members 29 or the electrode terminals and to increase the electrical contact area between the conductive members 29 and the electrode terminals including the area in which the conductive metal powders 32 are interposed. Accordingly, it is possible to reduce the contact resistance between the bumps 26 as the terminals of the X and Y drivers 17 and 18 as an electronic component and the electrode terminals as the lines of the electro-optical device substrate at low cost.

The size of the metal powders 32 is smaller than the sum of the height D (D in FIG. 6) of the conductive members 29 from the surface of the protrusions and the height E (E in FIG. 6) of the electrode terminals 20 from the surface of the first substrate in the surface-contact area C (C in FIG. 5) of, for example, a diameter L. Accordingly, when the protrusions 28 or the first substrate 5 is hard, it is possible to prevent the metal powders 32 from partially destroying the conductive members 29 or the electrode terminals not to reduce the contact resistance sufficiently. In addition, it is possible to prevent the conductive members, for example, the second conductive members 31, and the electrode terminals around the metal powders 32 from being partially removed from the contact surfaces not to increase the electrical contact area sufficiently because the interposed metal powders 32 are too large. Accordingly, it is possible to reduce the contact resistance between the bumps 26 of the X and Y drivers 17 and 18 and the electrode terminals at low cost.

The amount of the metal powders 32 mixed into the adhesive 19 is 0.5 wt % or more and 30 wt % or less. Accordingly, it is possible to prevent the metal powders 32 from not being sufficiently interposed between the conductive members 29 and the electrode terminals because the amount of metal powders is smaller than 0.5 wt %. It is also possible to prevent the neighboring electrode terminals or the neighboring bumps from being short-circuited because the amount of metal powders is greater than 30 wt %.

Since the hardness of the metal powders 32 is equal to or greater than the hardness of at least one of the conductive members 29 and the electrode terminals, it is possible to prevent the interposed metal powders 32 from being crushed not to sufficiently form the concave surface in the conductive members 29 or the electrode terminals.

Since the metal powders 32 are driven into at least one of the conductive members 29 and the electrode terminals, the concave surface can be formed in at least one of the conductive members 29 and the electrode terminals. Accordingly, it is possible to increase the electrical contact area between the conductive members 29 and the electrode terminals due to the concave surface, in which the contact surface is substantially a plane. It is also possible to prevent the conductive members 29 and the electrode terminals around the interposed metal powders 32 from being pulled and separated by the metal powders 32, by driving the metal powders into the conductive members or the electrode terminals.

Since a plurality of bumps 26 as the terminals of the electronic component is provided and the protrusion 28 is formed in each bump 26, it is possible to separate the protrusions 28 of the neighboring bumps 26 in the X and Y drivers 17 and 18 apart from each other and to prevent the neighboring bumps from being short-circuited even with further decrease in pitch. In addition, it is possible to enhance the reliability in electrical connection between the electrode terminals as the lines on the electro-optical device substrate and the bumps 26 as the terminals of the electronic component. The adhesive 19 can be easily spread between the neighboring protrusions 28. Accordingly, it is possible to reduce non-uniform stress or non-uniform mixture of the metal powders 32 mixed into the adhesive in the mounting area of the X and Y drivers 17 and 18 pressed on the second substrate.

The conductive member 29 has a two-layered structure of the first conductive member 30 formed on the protrusion and the second conductive member 31 formed on the first conductive member, and the second conductive member is made of gold or titanium. Accordingly, even when the second conductive member 31 is made of gold or titanium and the protrusion 28 is made of resin, by disposing nickel as the first conductive member 30 therebetween, it is possible to surely form the conductive member 29 on the protrusion 28 and to prevent increase in cost due to the conductive member all made of gold.

One metal particle of the metal powders 32 is interposed in the direction (the Z axis direction in FIG. 5) perpendicular to the contact surface of the conductive member 29 and the electrode terminal. Accordingly, it is possible to prevent two or more metal particles from being interposed in the direction perpendicular to the contact surface to destroy the conductive member or to make the contact state around the interposed metal powders 32 unstable. As a result, it is possible to make the electrical connection between the X and Y drivers 17 and 18 and the electrode terminals more stable.

The diameter of the metal powders 32 is set to 0.1 μm or more and 5 μm or less. Accordingly, when the protrusions 28 or the first substrate 5 is hard, it is possible to prevent the metal powders 32 from partially destroying the conductive members 29 or the electrode terminals not to reduce the contact resistance sufficiently because the metal powders is too large. In addition, it is possible to prevent the conductive members 29 or the electrode terminals around the interposed metal powders 32 from being partially removed from the contact surface not to increase the electrical contact area sufficiently because the interposed metal powders 32 are too large. Accordingly, it is possible to reduce the contact resistance between the bumps 26 and the electrode terminals at low cost. It is also possible to prevent the concave surface from not being formed in an enough size to further increase the electrical contact area between the conductive member 29 and the electrode terminals because the metal powders are too small.

Modified Example 1

Modified example 1 of the liquid crystal display device according to the first embodiment will be described. Modified example 1 is different from the first embodiment in that the protrusions as the terminals of the electronic component are not independent of the bumps, and thus the different is mainly described. The same elements as those of the first embodiment are denoted by the same reference numerals as those of the first embodiment and description there of is omitted.

Figure 7:
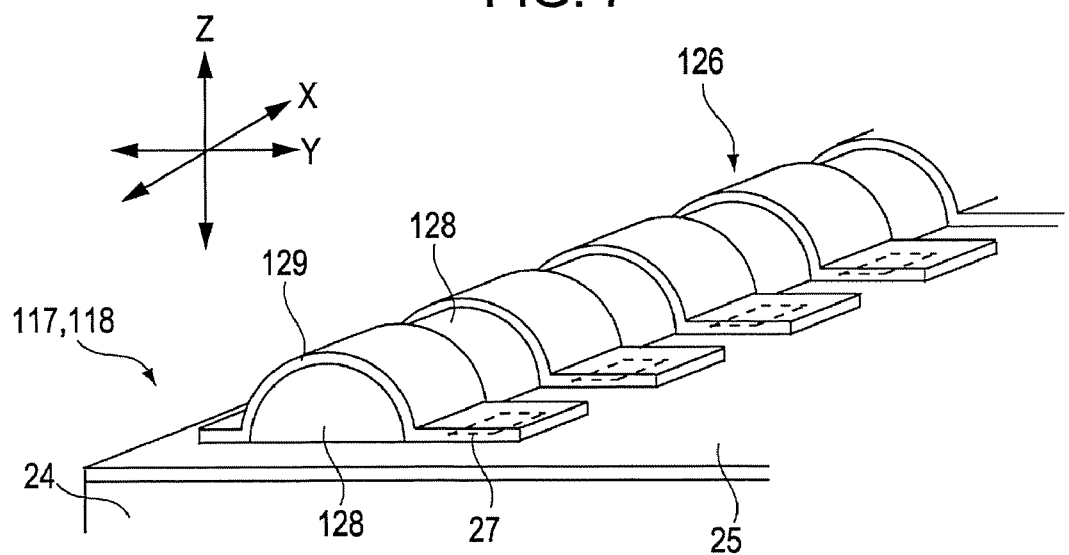
FIG. 7 is a partial schematic perspective view of a mounting surface of X and Y drivers according to Modified Example 1.

FIG. 7 is a partial perspective view schematically illustrating the mounting surface of the X and Y drivers according to Modified example 1.

As shown in FIG. 1, the liquid crystal display device 101 includes the liquid crystal panel 102 as the mounting structure and the flexible substrate 3 as the circuit board electrically connected to the liquid crystal panel 102. Here, the lighting device such as backlight and other accessory devices (not shown) are attached to the liquid crystal display device 101, in addition to the flexible substrate 3.

The liquid crystal panel 102 includes the first substrate 5 and the second substrate 6 as electro-optical device substrates bonded to each other with a sealing member 4, and a liquid crystal as an electro-optical material such as a twisted nematic (TN) liquid crystal 7 enclosed between the first and second substrates 5 and 6.

The first substrate 5 includes the extension 14 extending from the outer circumference of the second substrate 6. The gate electrode lines 15 and the source electrode lines 16 are formed in the extension 14. The X driver 117 and the Y driver 118 for driving the liquid crystal as electronic components electrically connected to the electrode lines are mounted with an adhesive 19 therebetween.

As shown in FIG. 7, the X and Y drivers 117 and 118 include a driver body 24, an insulating layer 25 covering the mounting surface of the driver body 24, and a plurality of bumps 126 as terminals of the electronic components on the insulating layer 25.

The bumps 126 are arranged separate from each other on the surface of the insulating layer 25 as the mounting surface of the X and Y drivers 117 and 118, as shown in FIG. 5, and include a protrusion 128 protruded to the electrode terminals or the input terminals as the lines of the substrate and a conductive member 129 formed on the protruded surface of the protrusion 128.

The protrusion 128 is made of an elastic material such as epoxy resin and has a shape (semi-cylindrical shape) obtained by vertically cutting a cylinder. Each protrusion is disposed on the insulating layer so that the longitudinal direction thereof is equal to the X axis direction in FIG. 7. That is, the protrusions 128 are not independent of the respective bumps 126 arranged in a line in the X axis direction in FIG. 7 on the surface of the insulating layer 25.

Although not shown, the protrusions of the bumps electrically connected to the electrode terminals 20 among the bumps 126 and the protrusions of the bumps electrically connected to the input terminals 21 may be disposed independently, or may be disposed in plural lines, for example, in two rows.

As shown in FIG. 7, the conductive member 129 is formed on the protruded surface of the protrusion 128 of each bump 126 and has a belt shape extending over the vertex of the semi-circular section of the protrusion 128 in the direction (the Y axis direction in FIG. 7) perpendicular to the longitudinal direction of the protrusion 128.

An end in the Y axis direction of the belt-shaped conductive member 129 extends to the pad 27 and is electrically connected to the lines in the driver body 24 through the contact hole. The other end extends to the insulating layer 25 which is a mounting surface opposite to the pad 27 with the protrusion 128 therebetween.

Although not shown in FIG. 7, modified example 1 is similar to the first embodiment in that the conductive member 129 has a two-layered structure of the first conductive member 30 made of nickel or the like and the second conductive member 31 made of gold (Au) or titanium (Ti), and the second conductive member is disposed as the outermost surface.

According to Modified example 1, since the protrusions 128 of the bumps 126 are not formed independent of each other, but the protrusion 128 with a semi-cylindrical shape of the bump electrically connected to the electrode terminals 20 is disposed on the insulating layer so that the longitudinal direction of the semi-cylindrical shape is equal to the X axis direction in FIG. 7, it is possible to reduce the manufacturing cost due to its easy manufacturing in comparison with the case that the protrusions are formed individually.

Second Embodiment

A liquid crystal display device according to a second embodiment of the invention will be described. The second embodiment is different from the first embodiment in that the X and Y drivers are mounted by a COF (Chip On Film) mounting method, and the difference will be mainly described. The same elements as those of the first embodiment are denoted by the same reference numerals as those of the first embodiment and description thereof is omitted.

Figure 8:
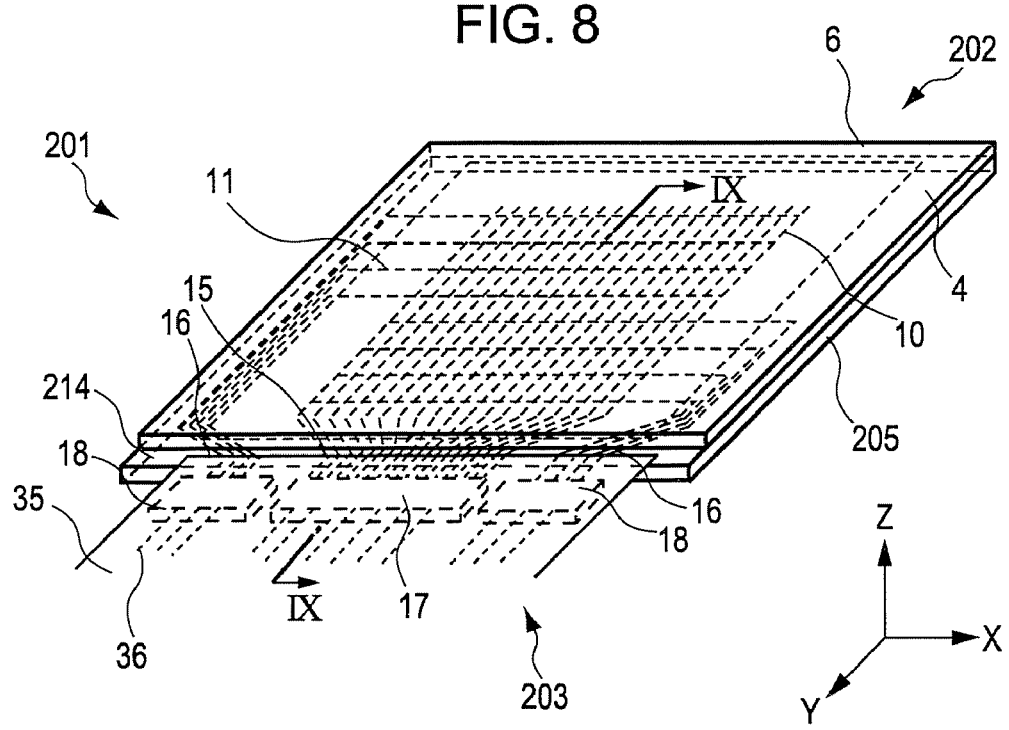
FIG. 8 is a schematic perspective view of a liquid crystal display device according to a second embodiment of the invention.
Figure 9:
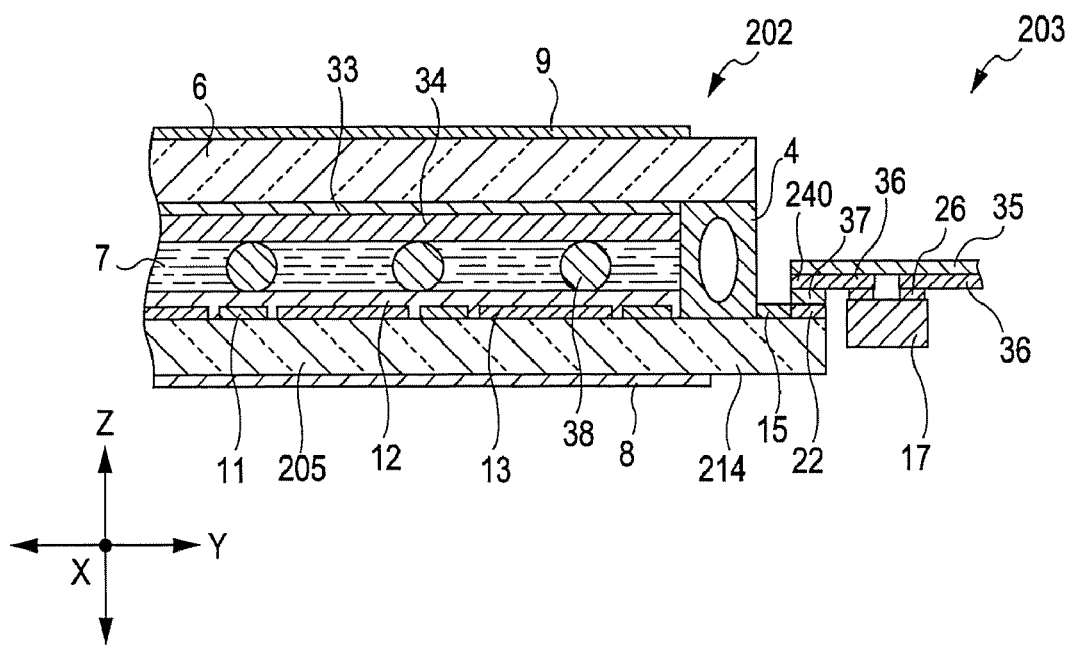
FIG. 9 is a schematic sectional view taken along Line IX-IX FIG. 8.
Figure 10:
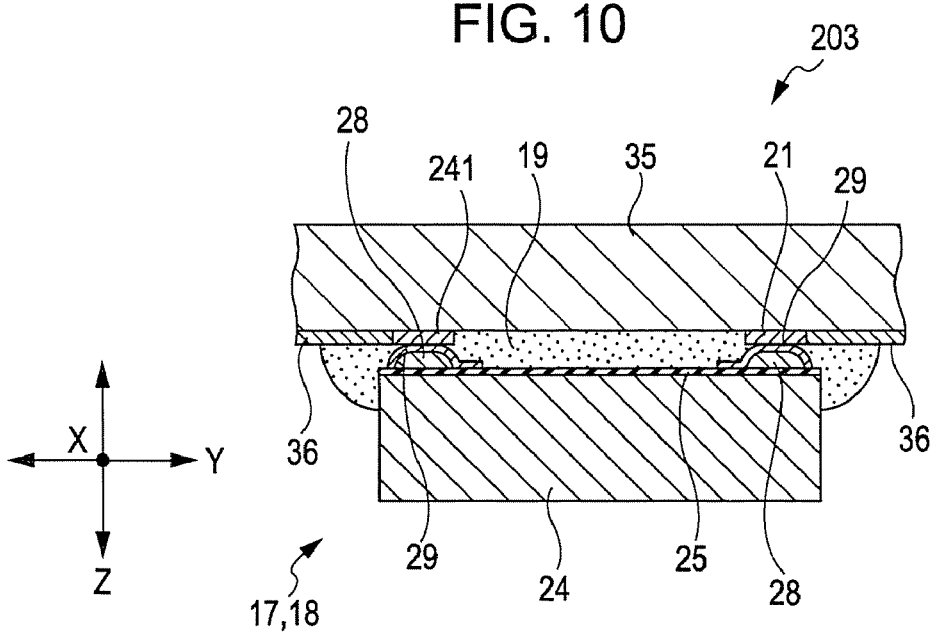
FIG. 10 is a diagram illustrating a mounting state of the X and Y drivers according to the second embodiment.

FIG. 8 is a schematic perspective view of a liquid crystal display device according to the second embodiment of the invention, FIG. 9 is a schematic cross-sectional view taken along Line IX-IX of FIG. 8 (the X driver is not cut), and FIG. 10 is a diagram illustrating a mounting state of the X and Y drivers.

Configuration of Liquid Crystal Display Device

As shown in FIG. 8, a liquid crystal display device 201 includes a liquid crystal panel 202 and a flexible substrate 203 which is a circuit board electrically connected to the liquid crystal panel 202. In addition to the flexible substrate 203, a lighting unit such as a backlight or other accessory mechanisms (not shown) can be attached to the liquid crystal display device 201 as needed.

As shown in FIGS. 8 and 9, the liquid crystal panel 202 includes a first substrate 205 and a second substrate 6 as a pair of electro-optical device substrates bonded to each other with a sealing member 4, and a twisted nematic (TN) liquid crystal 7 as an electro-optical material enclosed between both substrates.

The first and second substrates 205 and 6 are plate-shaped members made of a material such as glass having a light transmitting property and as shown in FIG. 9, polarizing films 8 and 9 are bonded to the outer surfaces (the surfaces opposite to the liquid crystal) of the first and second substrates 205 and 6.

On the inner surface (the surface facing the liquid crystal) of the first substrate 205, as shown in FIGS. 8 and 9, gate electrodes 10 are formed in the Y axis direction and source electrodes 11 as signal lines are formed in the X axis direction. The gate electrodes 10 and the source electrodes 11 are made of nickel or the like and are electrically connected to TFTs not shown.

The first substrate 205 includes an extension 214 extending from the outer circumference of the second substrate 6. Gate electrode lines 15 and source electrode lines 16 extending to the extension 214 from an area in which the gate electrodes 10 and the source electrodes 11 are surrounded with the sealing member 4 are formed in the extension 214. External connection terminals 22 for receiving current from, for example, a flexible substrate 203 electrically connected to the electrode lines are formed.

The flexible substrate 203 has a line pattern 36 as lines formed on a base member 35 out of copper (Cu), as shown in FIG. 8. An X driver 17 and a Y driver 18 for driving the liquid crystal as electronic components electrically connected to the line pattern 36 are mounted with an adhesive 19 therebetween.

The line pattern 36 includes output terminals 240 electrically connected to the external connection terminals 22 of the first substrate 205, IC connecting terminals 241 electrically connected to the X and Y drivers 17 and 18, and input terminals 21.

As shown in FIG. 8, the X driver 17 is electrically connected to the gate electrodes 10 through the gate electrode lines 15, and the Y driver 18 is electrically connected to the source electrodes 11 through the source electrode lines 16.

Specifically, as shown in FIG. 10, the adhesive 19 bonds and fixes the X and Y drivers 17 and 18 to the base member 35 so that the conductive members 29 of a plurality of bumps 26 formed on the mounting surface of the X and Y drivers 17 and 18 come in contact with the IC connecting terminals 241 or the input terminals 21 as lines disposed on the circuit board. Metal powders 32 are mixed in the adhesive 19, as shown in FIG. 5.

Accordingly, as shown in FIG. 6, the metal powders 32 are interposed between the second conductive members 31 of the conductive member, and the IC connecting terminals 241 and the input terminals 21, the metal powders 32 are driven into the second conductive members 31 or the IC connecting terminals 241, and thus the concave surfaces are formed in the second conductive members 31 or the IC connecting terminals 241 to correspond to the outline of the metal powders 32 driven into the second conductive members 31 or the electrode terminals. By forming the concave surfaces, the electrical contact area between the IC connecting terminals as the lines of the circuit board and the conductive members 29 of the bumps 26 as the terminals of an electronic component is increased, thereby reducing the contact resistance at low cost.

In FIG. 6, the concave surfaces are not formed in the base member, but the metal powders 32 may be driven into the base member, thereby forming the concave surfaces in the base member.

Method of Manufacturing Liquid Crystal Display Device

The method of manufacturing the liquid crystal display device 201 is different from that of the first embodiment, in that the X and Y drivers 17 and 18 as electronic components are mounted on the flexible substrate 203, and thus the difference is mainly and simply described.

First, a liquid crystal panel 202 is manufactured.

For example, the TFTs, the gate electrodes 10, the source electrodes 11, and the pixel electrodes 13 are formed on the surface of the first substrate 205 facing the liquid crystal, and the alignment layer 12 is formed thereon and is subjected to a rubbing process, thereby completing the first substrate. The gate electrode lines 15, the source electrode line 16, the electrode terminals 20, the input terminals 21, and the external connection terminals 22 can be formed at the same time as forming the gate electrodes 10 or the source electrodes 11.

The underlying layer, the reflecting layer, or the coloring layer is formed on the surface of the second substrate 6 facing the liquid crystal as needed, the common electrode 33 is formed thereon, and the alignment layer 34 is formed and subjected to the rubbing process, thereby completing the second substrate.

A gap material 38 is deposited on the second substrate and the first substrate and the second substrate are bonded to each other with the sealing member 4 therebetween. Thereafter, the liquid crystal 7 is injected through an injection port not shown of the sealing member 4, the injection port of the sealing member 4 is sealed, and the polarizing films 8 and 9 and the like are bonded to the outer surfaces of the first and second substrates 205 and 6, thereby completing the liquid crystal panel 202.

Next, the flexible substrate 203 is manufactured.

The output terminals 240, IC connecting terminals 241, and the input terminals 21 as the line pattern 36 are formed on a flexible film-shaped base member 35 by the use of a spattering method or a photolithography method.

An insulating member not shown is formed on the base member 35 so that the IC connecting terminals 241 or the input terminals 21 are exposed.

The film-shaped adhesive 19, in which the metal powders 32 are uniformly mixed in advance so that the amount of metal powders is 0.5 wt % or more and 30 wt % or less, is disposed on the flexible substrate 203 so as to cover the IC connecting terminals 241 and the input terminals 21 in the mounting area of the X driver 17 and the Y driver 18 on the base member.

Thereafter, the X driver 17 and the Y driver 18 are pressed on the IC connecting terminals 241 and the input terminals 21 with a predetermined pressure by the use of a pressing head, and are pressed and mounted at about 300° C.

Then, as shown in FIG. 5, the metal powders 32 mixed in the adhesive 19 are interposed between the bumps 26 of the X driver 17 and the Y driver 18, and the IC connecting terminals 241 and the input terminals 21. By further pressing them, as shown in FIG. 6, the metal powders 32 are driven into the second conductive members 31 or the IC connecting terminals, and thus the concave surfaces are formed along the outline of the metal powders 32 driven into the second conductive members 31 or the IC connecting terminals. In this state, the X driver 17 and the Y driver 19 are connected and fixed to the base member 35.

Other electronic components and the like are mounted and formed to complete the flexible substrate 203.

Next, the output terminals 240 electrically connected to the line pattern 36 of the flexible substrate 203 are electrically connected to the external connection terminals 22 of the liquid crystal panel 202 through an ACE 37.

Thereafter, the lighting device such as a backlight is attached to the liquid crystal panel as needed, thereby completing the liquid crystal display device 201.

The method of manufacturing the liquid crystal display device 201 is finished.

According to the second embodiment, since the metal powders 32 are mixed in the adhesive 19 and the metal powders 32 are interposed between the conductive members 29 of the bumps 26 as the terminals of an electronic component and the IC connecting terminals as the lines of a circuit board, it is possible to form the concave surfaces on the contact surfaces of the conductive members 29 or the IC connecting terminals and to increase the electrical contact area between the conductive members 29 and the IC connecting terminals including the area in which the conductive metal powders 32 are interposed. Accordingly, it is possible to provide a liquid crystal display device 201 in which the contact resistance between the bumps 26 and the IC connecting terminals is reduced at low cost.

The size of the metal powders 32 is set smaller than the sum of the height D (D in FIG. 6) of the conductive members 29 from the surface of the protrusions and the height E (E in FIG. 6) of the IC connecting terminals 20 from the base member in the surface-contact area C (C in FIG. 5) of, for example, the maximum diameter L (L in FIG. 6). Accordingly, when the protrusions 28 or the base member 35 is hard, it is possible to prevent the metal powders 32 from partially destroying the conductive members 29 or the IC connecting terminals not to reduce the contact resistance sufficiently. In addition, it is possible to prevent the conductive members 29 or the IC connecting terminals around the interposed metal powders 32 from being partially removed from the contact surfaces not to increase the electrical contact area sufficiently because the interposed metal powders 32 are too large. Accordingly, it is possible to reduce the contact resistance between the conductive members 29 of the bumps 26 and the IC connecting terminals as lines on the circuit board at low cost.

Third Embodiment

A liquid crystal display device according to a third embodiment of the invention will be described. The third embodiment is different from the first embodiment, in that a conductive member has a single-layered structure and an oxide layer is generated on the surface of the conductive members and the surfaces of electrode terminals as lines on an electro-optical device substrate. The difference is mainly described. The same elements as those of the first embodiment are denoted by the same reference numerals as those of the first embodiment and description thereof is omitted.

FIG. 11 is a diagram illustrating a contact state between bumps and terminals on a substrate according to the third embodiment of the invention and FIG. 12 is a partially enlarged view illustrating interposed metal powders shown in FIG. 11.

Configuration of Liquid Crystal Display Device

As shown in FIG. 1, a liquid crystal display device 401 includes a liquid crystal panel 402 as a mounting structure and a flexible substrate 3 as a circuit board electrically connected to the liquid crystal panel 202. In addition to the flexible substrate 3, a lighting unit such as a backlight or other accessory mechanisms (not shown) can be attached to the liquid crystal display device 401 as needed.

As shown in FIGS. 1 and 2, the liquid crystal panel 402 includes a first substrate 5 and a second substrate 6 as electro-optical device substrates bonded to each other with a sealing member 4, and a liquid crystal as an electro-optical materials enclosed between the first and second substrates 5 and 6, for example, a twisted nematic (TN) liquid crystal 7.

As shown in FIGS. 2 and 11, the first substrate 5 includes an extension 14 extending from the outer circumference of the second substrate 6. Gate electrode lines 15 and source electrode lines 16 extending to the extension 14 from an area in which the gate electrodes 10 and the source electrodes 11 are surrounded with the sealing member 4 are formed in the extension 14. An X driver 417 and a Y driver 418 for driving the liquid crystal as electronic components electrically connected to the electrode lines are mounted with an adhesive 19 therebetween.

As shown in FIG. 3, electrode terminals 420 as lines electrically connected to the gate electrode lines 15 and the source electrode lines 16 and input terminals as lines for inputting current from the flexible substrate 3 to the X and Y drivers 417 and 418 are formed in the area corresponding to a mounting surface of the X and Y drivers 417 and 418 on the extension 14.

The electrode terminals 420 and the input terminals 421 are made of a material such as nickel or aluminum which can be easily oxidized, and have an oxide layer 450 formed by oxygen in air on the surfaces thereof (facing the X and Y drivers to be mounted), as shown in FIG. 12.

As shown in FIG. 11, the X and Y drivers 417 and 418 include a driver body 24, an insulating layer 25 covering the mounting surface of the driver body 24, and a plurality of bumps 426 as terminals of the electronic components on the insulating layer 25 as shown in FIG. 4.

The bumps 426 are arranged separate from each other on the surface of the insulating layer 25 as the mounting surface of the X and Y drivers 417 and 418, as shown in FIG. 4, and include a protrusion 28 protruded to the electrode terminals or the input terminals as lines of an electro-optical device substrate from the insulating layer 25 and a conductive member 429 formed on the protruded surface of the protrusion 28.

The conductive member 429 is formed on the protruded surface of the protrusion 28 and has a belt shape extending over the vertex of the protruded surface in the Y axis direction, as shown in FIGS. 4 and 11. An end in the Y axis direction of the belt-shaped conductive member 429 extends to the pad 27 and is electrically connected to the lines in the driver body 24 through the contact hole.

The other end extends to the insulating layer 25 which is a mounting surface opposite to the pad 27 with the protrusion 28 therebetween.

The conductive member 429 is made of a material such as nickel or aluminum which can be easily oxidized, and have an oxide layer 451 formed by oxygen in air on the surface thereof, as shown in FIG. 12.

As shown in FIG. 11, each bump 426 has a region G (G in FIG. 11) in which the bump 426 is further pressed and crushed in comparison with before the bump 426 is mounted on the driver body (in the Z axis direction in FIG. 11) and the contact of the conductive member 429 on the bump 426 with the electrode terminal with the oxide layers 450 and 451 is changed from a dot contact to a surface contact, thereby reducing the contact resistance between the bump 426 and the electrode terminal as a terminal of the substrate. The oxide layers 450 and 451 are not shown in FIG. 11.

On the other hand, as shown in FIG. 3, the adhesive 19 bonds and fixes the X and Y drivers 417 and 418 to the extension 14 so that the bumps 426 formed on the mounting surfaces of the X and Y drivers 417 and 418 come in contact with the electrode terminals 420 and the input terminals 421 with the oxide layers 450 and 451 therebetween. As shown in FIG. 11, metal powders 32 are mixed in the adhesive 19.

Accordingly, in the surface-contact area G between the conductive members 429 and the electrode terminals with the oxide layers 450 and 451 therebetween, as shown in FIG. 11, the metal powders 32 are interposed between the conductive members 429 and the electrode terminals and as shown in FIG. 12, the metal powders 32 are driven into the oxide layers 450 and 451, the conductive members 429, and the electrode terminals.

Among the oxide layers 450 and 451, as shown in FIG. 12, the oxide layer 450 is interposed between the metal powders 32 and the electrode terminals and the oxide layer 451 is interposed between the metal powders 32 and the conductive members 429 in the area H (H in FIG. 12) in which the metal powders 32 are interposed.

In an area in which the metal powders 32 are not interposed, as shown in FIG. 12, the oxide layer 450 and the oxide layer 451 are overlapped and interposed between the conductive members 429 and the electrode terminals so as to form a stacked structure.

The oxide layer 450 is destroyed in at least a part of the area H in which the metal powders 32 are interposed to form an opening 452 as shown in FIG. 12. The metal powders 32 are exposed from an open area I (I in FIG. 12) of the opening and thus the metal powders 32 come in direct contact with the electrode terminals.

Similarly, the oxide layer 451 is destroyed in at least a part of the area H in which the metal powders 32 are interposed to form an opening 452. The metal powders 32 are exposed from an open area I (I in FIG. 12) of the opening and thus the metal powders 32 come in direct contact with the conductive members 429.

Accordingly, it is possible to further reduce the contact resistance between the conductive members 429 and the electrode terminals as lines due to the oxide layers 450 and 451.

Although it has been described that the oxide layers 450 and 451 are partially destroyed and the metal powders 32 come in direct contact with the conductive members and the like, the invention is not limited to it, but an opening in which parts of the oxide layers 450 and 451 are decreased in thickness due to tension stress may be formed. In this case, since the thickness of the oxide layers serving as the contact resistance is decreased, it is possible to reduce the contact resistance.

Even when the thickness of the oxide layers is not decreased even by interposing the metal powders 32, the contact area between the conductive members 429 and the electrode terminals with the oxide layers 450 and 451 therebetween is changed from the substantial plane contact in the area H to the surface contact in the concave surfaces by interposing the metal powders 32. It is possible to reduce the contact resistance between the conductive members 429 and the electrode terminals as lines by the increased amount of contact area.

Method of Manufacturing Liquid Crystal Display Device

A method of manufacturing the liquid crystal display device 401 having the above-mentioned configuration is almost similar to that of the first embodiment, and thus the oxide layers are mainly and simply described.

FIG. 13 a diagram illustrating a state in which the oxide layers come in first contact with the metal powders after being pressed and FIG. 14 is a diagram illustrating a state in which the metal powders are partially driven into the conductive members or the like while being further pressed.

The film-shaped adhesive 19, in which the metal powders 32 are uniformly mixed in advance so that the amount of metal powders is 0.5 wt % or more and 30 wt % or less, is disposed on the first substrate 5 so as to cover the electrode terminals 420 and the input terminals 421, on which the oxide layer 450 is generated, in the mounting area of the X driver 417 and the Y driver 418 of the extension 14.

Thereafter, the X driver 417 and the Y driver 418 are disposed and temporarily pressed on the adhesive 19 so that the bumps 426 in which the oxide layer 451 is generated correspond to the electrode terminals 420 and the input terminals 421.

The X driver 417 and the Y driver 418 are pressed (in the arrow direction of FIG. 14) on the electrode terminals 420 and the input terminals 421, in which the oxide layer 450 is formed, with a predetermined pressure by the use of a pressing head, and then are mainly pressed at about 300° C. Then, as shown in FIG. 14, the metal powders 32 interposed between the oxide layer 451 on the conductive members 429 and the oxide layer 450 on the electrode terminals are driven into both oxide layers 450 and 451, the conductive members 429, and the electrode terminals.

Accordingly, the tension stress starts acting on the oxide layers 450 and 451.

By further pressing the X and Y drivers, as shown in FIG. 12, the conductive members 429 come in two-dimensional contact with the electrode terminals with the oxide layers 450 and 451 therebetween in the area in which the metal powders 32 are not interposed.

When the tension stress acting on the open area I is above a critical value, as shown in FIG. 12, the oxide layers 450 and 451 are destroyed in at least a part of the area H to form the opening 452. The metal powders 32 are exposed in the open area I (I in FIG. 12) of the opening and the metal powders 32 come in direct contact with the conductive members and the like.

The method of manufacturing the liquid crystal display device 401 is finished.

According to the third embodiment of the invention, the conductive members 429 and the electrode terminals as lines have the oxide layers 450 and 451 covering the surfaces thereof and the oxide layers 450 and 451 have the opening 452 formed in parts of the oxide layers 450 and 451 by the metal powders 32 interposed in the contact area G (G in FIG. 11). Accordingly, even when the oxide layers 450 and 451 are formed on the surfaces of the conductive members 429 and the electrode terminals during manufacturing the liquid crystal display device 401, the oxide layers 450 and 451 are widely spread and thinned by the interposed metal powders 32, or parts of the oxide layers are destroyed to form the opening 452. Therefore, it is possible to further reduce the contact resistance between the conductive members 429 and the electrode terminals due to the oxide layers 450 and the 451.

Fourth Embodiment

Electronic Apparatus

An electronic apparatus according to a fourth embodiment of the invention including the above-mentioned liquid crystal display device 1, 101, 201, or 401 will be described. The same elements as the elements of the first embodiment are denoted by the same reference numerals as the elements of the first embodiment and description thereof is omitted.

Figure 15:
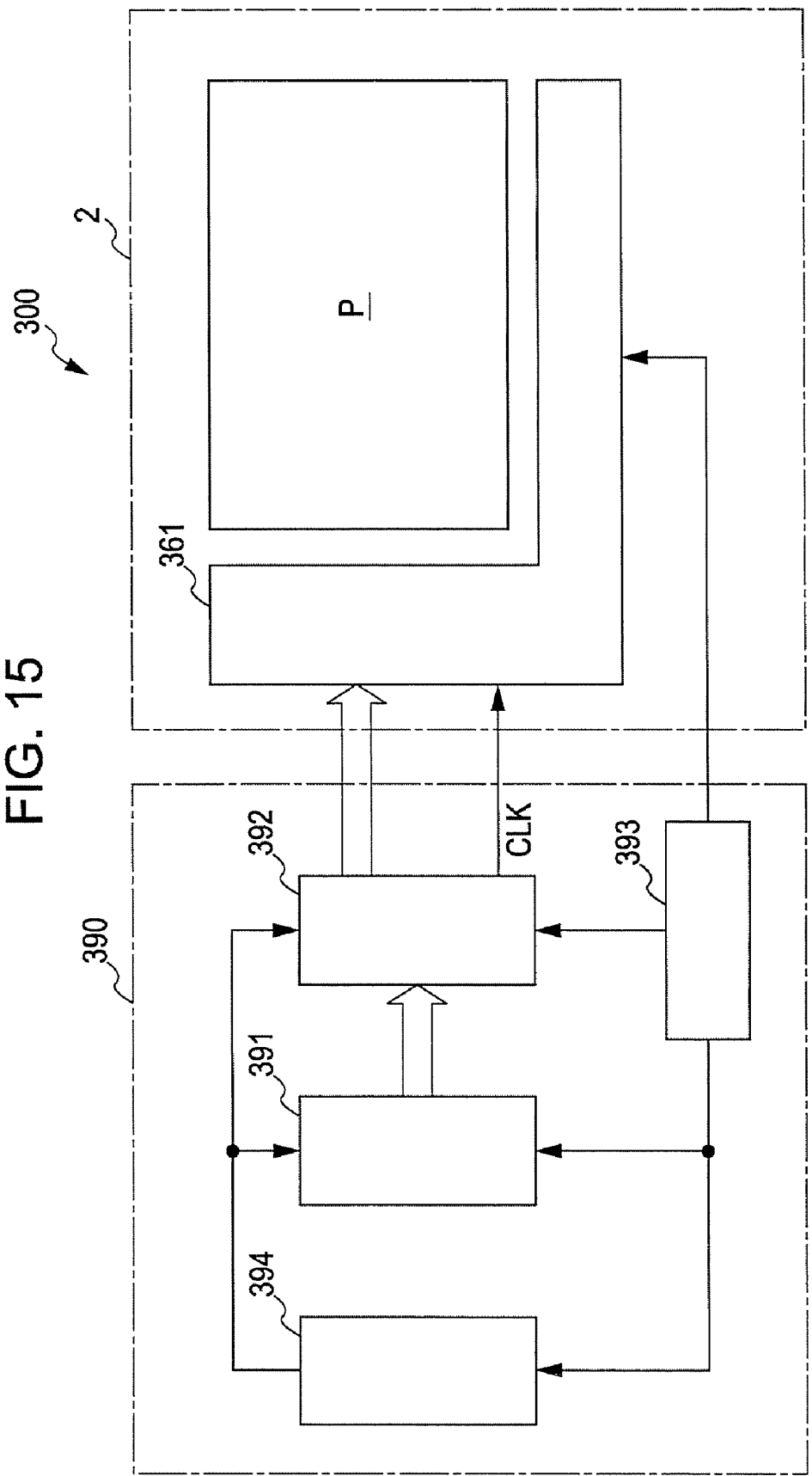
FIG. 15 is a diagram schematically illustrating a configuration of a display control system of an electronic apparatus according to a fourth embodiment.

FIG. 15 is a diagram schematically illustrating the entire configuration of a display control system of the electronic apparatus according to the fourth embodiment of the invention.

The electronic apparatus 300 includes a liquid crystal panel 2 and a display control circuit 390 as the display control system, as shown in FIG. 15. The display control circuit 3990 includes a display information output source 391, a display information processing circuit 392, a power supply circuit 393, and a timing generator 394.

The liquid crystal panel 2 includes a driving circuit 361 for driving a display area P.

The display information output source 391 includes a memory composed of a ROM (Read Only Memory) or a RAM (Random Access Memory), a storage unit composed of a magnetic recording disc or an optical recording disk, and a synchronization circuit synchronously outputting digital image signals. The display information output source 391 supplies display information such as a predetermined format of image signals to the display information processing circuit 392 on the basis of a variety of clock signals generated by the timing generator 394.

The display information processing circuit 392 includes a variety of known circuits such as a serial-parallel conversion circuit, an amplification and inversion circuit, a rotation circuit, a gamma correction circuit, and a clamp circuit, and processes the input display information to supply the image information to the driving circuit 361 along with the clock signals CLK. The power supply circuit 393 supplies a predetermined voltage to the above-mentioned elements.

According to the fourth embodiment, since the electronic apparatus 300 employs the liquid crystal display device 1 capable of decreasing the contact resistance between the terminals of the electronic component and the lines on the electro-optical device substrate at low cost in spite of decrease in pitch, it is possible to easily accomplish decrease in size and enhancement in performance and to improve the electrical reliability thereof.

In recent years, electronic apparatuses with improved reliability and high performance have been required, and thus the significance of the invention for providing such an electronic apparatus is very great.

Specific examples of the electronic apparatus can include a touch panel having a liquid crystal panel, a projector, a liquid crystal TV, a view finer type or monitor direct-view type video tape recorder, a car navigation apparatus, a pager, an electronic pocketbook, an electronic calculator, a word processor, a work station, a television phone, and a POS terminal, in addition to the mobile phone and the personal computer. Of course, the above-mentioned liquid crystal display device 1, 101, 201, or 401 can be used as a display unit of the electronic apparatuses.

The electro-optical device and the electronic apparatus according to the invention are not limited to the above-mentioned examples, but may be modified in various forms without departing from the gist of the invention. The embodiments and the modified examples may be combined without departing from the gist of the invention.

Although the invention has been described with reference to the exemplary embodiments, the invention is not limited to the exemplary embodiments, but may be properly modified for practice without departing from the technical spirit of the invention.

In the above-mentioned embodiments and modified examples, a TFT-element active matrix type liquid crystal display device has been described, but the invention is not limited to it, but may be applied to a thin film diode element active matrix type or passive matrix type liquid crystal display device. Accordingly, in a variety of liquid crystal display devices, it is possible to decrease the contact resistance between terminals of electronic components and lines on a substrate at low cost.

In the above-mentioned embodiments and modified examples, it has been described that each bump as terminals of an electronic component includes the protrusion made of an elastic material and the conductive member disposed on the protrusion and electrically connected to the line of the electro-optical device substrate. However, the invention is not limited to the structure, but the protrusion may be made of a conductive material without disposing the protrusion made of an elastic material on the bump and the protrusion may be electrically connected to the lines of the electro-optical device substrate. Accordingly, it is possible to cope with a variety of electro-optical devices.

The entire disclosure of Japanese Patent Application No. 2005-229129, filed Aug. 8, 2005 is expressly incorporated by reference herein.

What is claimed is:

1. An electro-optical device comprising:
a substrate;
a wire formed on the substrate;
an electronic component having a terminal composed of an elastic member protruding toward the substrate, and a conductive member disposed on a substrate-side surface of the elastic member; and
an adhesive disposed between the conductive member and the wire and connecting the electronic component to the substrate,
the adhesive including metal powder having a hardness equal to or greater than a hardness of at least one of the conductive member and the wire,
wherein the metal powder forms concavities in at least one of a contact area between the metal powder and the conductive member, and a contact area between the metal powder and the wire, and
wherein the conductive member and the wire are adhered in surface contact with each other in an area between the metal powder.

2. The electro-optical device according to claim 1, wherein the concavities are formed in the conductive member.

3. The electro-optical device according to claim 1, wherein a particle size of the metal powder is smaller than a combined thickness of the conductive member and the wire where the conductive member and the wire are adhered in surface contact with each other.

4. An electro-optical device according to claim 1, wherein the substrate is an electro-optical device substrate.

5. An electro-optical device according to claim 1, wherein the substrate is a circuit substrate which is electrically connected to an electro-optical device substrate.

6. The electro-optical device according to claim 1, wherein a percentage of the metal powder added to the adhesive is 0.5 wt % or more and 30 wt % or less.

7. The electro-optical device according to claim 1, further comprising an oxide film that covers at least one of a surface of the conductive member and a surface of the wire, wherein the oxide film has an opening formed by the metal powder disposed to contact the conductive member and the wire.

8. An electronic apparatus comprising the electro-optical device according to claim 1.

* * * * *

UNITED STATES PATENT AND TRADEMARK OFFICE
CERTIFICATE OF CORRECTION

PATENT NO. : 7,470,986 B2  Page 1 of 1
APPLICATION NO. : 11/462460
DATED : December 30, 2008
INVENTOR(S) : Ken Kaneko It is certified that error appears in the above-identified patent and that said Letters Patent is hereby corrected as shown below:

Title Page,
Item [73], Assignee:, "Sanyo Epson Imaging Devices Corp. (JP)" should be --Epson Imaging Devices Corporation (JP)--

| | |
|---|---|
| Column 5, Line 22: | "two" should be --too-- |
| Column 6, Line 5: | after "IX-IX" insert --of-- |
| Column 6, Line 13: | after "13" insert --is-- |
| Column 9, Line 11: | "show" should be --shown-- |
| Column 9, Line 37: | "μM" should be --μm-- |
| Column 13, Line 32: | "different" should be --difference-- |
| Column 13, Line 35: | "there of" should be --thereof-- |
| Column 19, Line 66: | after "13" insert --is-- |
| Column 20, Line 57: | after "and" delete "the", third occurrence |
| Column 21, Line 9: | "3990" should be --390-- |
| Column 21, Line 47: | "finer" should be --finder-- |

Signed and Sealed this

Twenty-fifth Day of August, 2009

David J. Kappos
*Director of the United States Patent and Trademark Office*